United States Patent [19]

Dalton et al.

[11] Patent Number: 4,589,928
[45] Date of Patent: May 20, 1986

[54] METHOD OF MAKING SEMICONDUCTOR INTEGRATED CIRCUITS HAVING BACKSIDE GETTERED WITH PHOSPHORUS

[75] Inventors: John V. Dalton, Allentown, Pa.; Kenneth J. Orlowsky, Middlesex, N.J.; Ashok K. Sinha, Allentown, Pa.

[73] Assignee: AT&T Bell Laboratories, Murray Hill, N.J.

[21] Appl. No.: 642,932

[22] Filed: Aug. 21, 1984

[51] Int. Cl.⁴ .................. H01L 7/50; H01L 21/324
[52] U.S. Cl. .......................... 148/1.5; 29/571; 29/578; 29/591; 148/175; 148/187; 148/DIG. 60; 148/DIG. 61
[58] Field of Search ............... 148/1.5, 187, 175; 29/571, 578, 591

[56] References Cited

U.S. PATENT DOCUMENTS

| | | | |
|---|---|---|---|
| 3,740,835 | 6/1973 | Duncan | 29/578 |
| 3,811,975 | 5/1974 | Van Lierop et al. | 148/DIG. 60 |
| 3,997,368 | 12/1976 | Petroff et al. | 148/1.5 |
| 4,018,626 | 4/1977 | Schwuttke et al. | 148/1.5 |
| 4,053,335 | 10/1977 | Hu | 148/174 |
| 4,114,256 | 9/1978 | Thibault et al. | 29/571 |
| 4,124,934 | 11/1978 | DeBrebisson | 29/590 |
| 4,131,487 | 12/1978 | Pearce et al. | 148/1.5 |
| 4,151,631 | 5/1979 | Klein | 29/571 |
| 4,291,322 | 9/1981 | Clemens et al. | 29/78 |
| 4,319,119 | 3/1982 | Runge | 219/121 LM |
| 4,410,375 | 10/1983 | Sawada et al. | 148/187 |

OTHER PUBLICATIONS

Pak et al. IBM-TDB, 18 (1975) 2183.

*Primary Examiner*—Upendra Roy
*Attorney, Agent, or Firm*—David I. Caplan

[57] ABSTRACT

For achieving dense packing of MOS transistors at the top surface of a silicon semiconductor body, second level metallization including arsenic doped polysilicon contacts are used in conjunction with a phosphorus gettering step at a time when the top surface is sealed against the introduction of phosphorus by an undoped sacrificial glass layer, i.e., which is essentially free of phosphorus. The second level metallization is thereafter completed by coating the polysilicon with a high conductivity metal, such as aluminum. During the gettering, the polysilicon contacts are insulated from the first level metallization by a planarized glass layer doped with phosphorus to a concentration below the saturation level of phosphorus in the glass.

12 Claims, 8 Drawing Figures

METHOD OF MAKING SEMICONDUCTOR INTEGRATED CIRCUITS HAVING BACKSIDE GETTERED WITH PHOSPHORUS

FIELD OF THE INVENTION

This invention relates to the fabrication of shallow-junction semiconductor integrated circuits and, more particularly, to such semiconductor circuits that have been gettered with phosphorus.

BACKGROUND OF THE INVENTION

A variety of very-large-scale-integrated (VLSI) circuits of practical importance include transistor devices with short channel lengths and with shallow source and drain pn junctions. Typically, electrical interconnections for the transistors are supplied by first and second metallization levels which are insulated from each other by a second level insulating layer, such as a phosphorus-doped glass layer.

For example, metal-oxide-semiconductor (MOS) transistors integrated in a silicon semiconductor body can have channel lengths corresponding to gate electrodes whose lengths are as short as about 1.0 micron or less. In such transistors the source and drain junction depths, beneath the front (top) surface of the silicon body, are advantageously rather shallow, typically about 0.3 micron or less, in order to achieve desired transistor device performance characteristics, especially high speed of operation. Such shallow junctions, in the case of n-channel MOS transistors, are ordinarily achieved by doping the source and drain regions in the silicon body with the impurity arsenic rather than phosphorus, which diffuses more rapidly than arsenic. As the pn junction depths become that shallow, however, the problem arises that metals such as aluminum included in contact window portions of the device, to make electrical access connections from the second level metallization to the source and drain regions in the semiconductor, will undesirably penetrate down through the junctions during required heating steps and consequently will degrade the performance of the transistors. In practice, the aluminum has been known to penetrate through junctions having depths less than a micron. To counteract this problem, a polycrystalline silicon (polysilicon) contact electrode layer is deposited in the contact windows prior to the deposition of the aluminum metal thereon, whereby this polysilicon contact layer suppresses the penetration of the aluminum to the junction. The polysilicon contact electrode layer is typically doped with phosphorus to supply both a desirably higher electrical conductivity to the polysilicon and a desirable source of phosphorus for gettering of impurities during relatively high temperature gettering treatments typically at a temperature of 1000 degrees C. When using aluminum to metallize the source/drain electrodes for the required integrated circuit interconnections, this gettering at high temperature must be performed prior to laying down the aluminum, because of the relatively low melting temperature (about 660 degrees C.) of the aluminum. Although phosphorus diffuses in the silicon body about four times as fast as arsenic, nevertheless the phosphorus in the polysilicon contacts do not adversely affect the shallow source and drain regions in the MOS transistors, because the distance of closest approach of each such contact from the nearest such junction is equal to at least the minimum linewidth of the lithographic patterning procedures that are used to define the line and space features of integrated circuits.

SUMMARY OF THE INVENTION

We have found in fabricating MOS transistors integrated in a silicon semiconductor that the phosphorus used in doping the polysilicon source and drain contact electrode layers sets an undesirable limit upon the distance between next neighboring transistors integrated at a front (top) surface of a semiconductor body, and hence undesirably decreases the packing density of transistors even though arsenic is used for doping the source and drain regions. We have found that distance of closest approach between edges of the contact windows of mutually adjacent source or drain terminal regions of next neighboring MOS transistors sets a limit upon the packing density, and this distance is determined (among other things) by the minimum available lithographic processing procedures. This minimum distance between the edges of neighboring contact windows is typically equal to the minimum width of the field oxide layer (separating the next neighboring transistors) as dictated by the minimum lithography, plus a fraction thereof to allow for the thickness of the portion of the second level insulating layer which is located on the sidewalls of the field oxide layer. Thus, as the minimum feature size of integrated circuits allowed by lithographic patterning procedures can be reduced to less than about 1.5 micron, and hence as the distance between neighboring contact window edges is made less than about 2.0 micron, some of the phosphorus from the polysilicon electrode laterally diffuses into the silicon body to such a lateral extent, during a desirable high temperature gettering (with phosphorus), that the source or drain terminal regions of different transistors are undesirably electrically coupled or shorted together, whereby the integrated circuit formed by these transistors becomes inoperative. Accordingly, we have found that in order to reduce the distance between next neighboring integrated circuit MOS transistor devices without shorting them, each of the polysilicon source and drain electrode contacts should be doped with the impurity arsenic (rather than phosphorus) prior to a gettering with phosphorus. Then, the gettering with phosphorus is performed by means of a high-temperature gettering treatment in an atmosphere containing phosphorus at a time when the entire front surface of the semiconductor body is protected against phosphorus penetration by means of a sacrificial protective layer, but at the same time the back (bottom) surface of the semiconductor is exposed. By a "sacrificial" layer it is meant that the layer is subsequently removed. For example, a glass layer deposited from undoped (phosphorus-poor) TEOS (tetraethyl-ortho-silicate) is used as the phosphorus-impervious sacrificial protective layer thus to protect the front surface, whereby no significant amounts of phosphorus are present in the sacrificial layer, and no significant amounts of phosphorus can penetrate through the polysilicon electrodes into the front surface even during the gettering with phosphorus. By an "undoped" TEOS it is meant that the deposited glass layer has a sufficiently lwo phosphorus concentration (i.e., well below the saturation level of about 8.5 percent phosphorus by weight) that relatively little or essentially no phosphorus penetrates or diffuses into the silicon body even at the high temperature of the gettering, whereby essentially no undesirable lateral spreading of the source and drain regions is caused by the gettering with phosphorus. In turn, the temperature and time duration used for the gettering should be selected appropriately. Also, this undoped glass layer advantageously fills any remaining portions of the apertures in a previously deposited second level insulating layer (for electrically insulating second level metal from first level metal) upon which an arsenic doped polysilicon layer has been deposited (but not yet patterned to form the polysilicon source and drain contact electrodes) for contacting arsenic doped source and drain regions in the semiconductor.

Thus the invention generally involves a method of fabricating a semiconductor integrated circuit integrated at a major surface of a semiconductor body including the step of gettering the body with phosphorus by heating the body at an elevated temperature in an atmosphere containing phosphorus at a time when the top surface, but not the bottom surface, of the body is protected against the penetration of phosphorus by means of a sacrificial glass layer which has a sufficiently low phosphorus concentration that essentially no phosphorus diffuses from it into the body.

Moreover, in this invention, the second level insulating layer can advantageously be P-glass, i.e., a glass layer doped with phosphorus, to a concentration of at least about 3 or 4 percent by weight. On the other hand, the phosphorus concentration in this P-glass layer is preferably significantly below the saturation level of phosphorus in the glass—i.e., preferably significantly below about 8.5 percent phosphorus by weight, typically in the approximate range of 3 percent to 6 percent phosphorus—so that the phosphorus in this P-glass layer does not significantly diffuse out of the P-glass through the polysilicon contact layer into the semiconductor. The presence of this phosphorus doping in this insulating P-glass layer also serves to control the fixed charges at the interface between the silicon dioxide layer and the top surface of the silicon semiconductor and to suppress undesired migration of ions such as sodium. Thus, the P-glass serves as a desirable passivation layer, in addition to serving as an electrically insulating layer.

After the high temperature gettering treatment, the phosphorus-impervious layer is removed to expose the arsenic doped polysilicon layer, and then an aluminum metallization layer can be deposited and patterned. To prevent electromigration induced failure of the aluminum metallization which would be caused by a nonuniform thickness of the aluminum when deposited upon a nonplanar surface, the top surface of the phosphorus doped insulating layer is planarized, hence the top surface of the polysilicon layer thereon is planar (except at the contacts to the semiconductor body), and hence the resulting thickness of the aluminum metallization strips is desirably uniform.

In a specific embodiment of the invention, an integrated circuit including a plurality of MOS transistors is fabricated at the top major surface of a silicon semiconductor body by means of a process comprising the steps of:

(1) forming relatively thick field oxide layer or areas of the top major surface located between gate-and-source-and-drain (GASAD) regions of the transistors to be formed;

(2) growing a relatively thin gate oxide layer in the GASAD regions;

(3) forming and patterning an arsenic doped polysilicon layer, overlaid with a metal silicide layer, on top of the gate and field oxide layers in accordance with the pattern of the first level metallization (including gate electrodes) of the desired integrated circuit, whereby the gate oxide layer is exposed at areas overlying the source and drain regions of the transistors to be formed in the semiconductor body;

(4) introducing arsenic through the exposed areas of the gate oxide into the semiconductor body to form arsenic-doped source and drain regions;

(5) forming and planarizing a P-glass layer deposited from phosphorus-doped TEOS so that the P-glass layer contains phosphorus in a concentration below the saturation level, and forming apertures therein at locations where electrical contacts to the arsenic-doped source and drain regions and to the first level metallization are to be formed;

(6) depositing another polysilicon layer for making these contacts;

(7) implanting arsenic into the last-mentioned polysilicon layer;

(8) forming an undoped TEOS glass layer, which is substantially free of and impervious to phosphorus, on the top surface of the structure being built, and removing any polysilicon, metal-silicide, or glass layers which have formed on the bottom surface of the structure;

(9) gettering the structure by a heat treatment in an ambient atmosphere containing phosphorus;

(10) removing the undoped TEOS glass everywhere from the top surface to expose the last-mentioned polysilicon layer;

(11) depositing an aluminum layer upon the last-mentioned polysilicon layer; and (12) patterning the aluminum layer and the last-mentioned polysilicon layer to form source and drain metallization interconnections in accordance with the desired integrated circuit.

BRIEF DESCRIPTION OF THE DRAWING

This invention, together with its features, advantages, and characteristics, may be better understood from the following detailed description when read in conjunction with the drawing in which.

DETAILED DESCRIPTION

Figure 1:
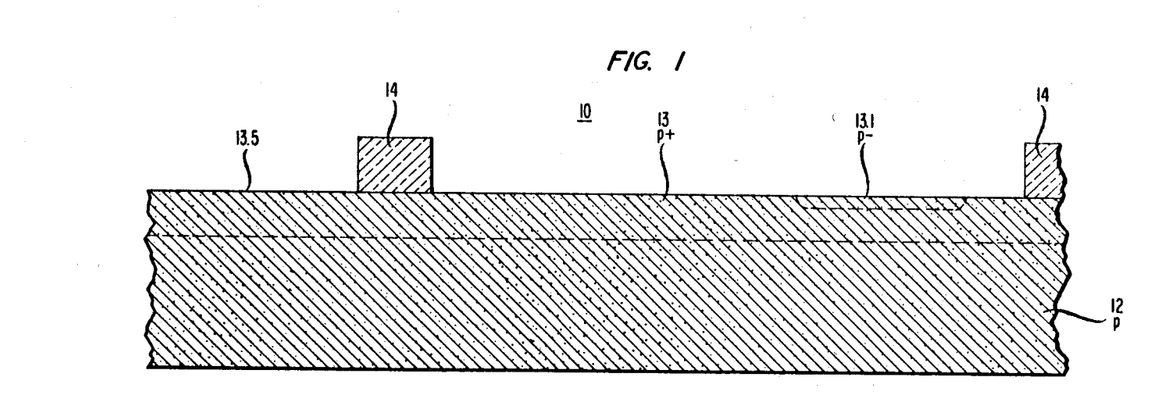
FIGS. 1-8 illustrate in cross section various successive stages in the fabrication of an integrated circuit in accordance with a specific embodiment of the invention.

As shown in FIG. 1, the starting material was a single crystal silicon wafer 12 of substantially uniform p-type conductivity oriented <100>. A relatively thick oxide layer of silicon dioxide, typically about 3,500 Angstroms thick, was thermally grown everywhere on a top major surface 13.5 of the wafer 12; and a uniform boron implant, was performed through the field oxide to form a p+ surface region 13 for control of the surface concentration of the field regions, as well as of the gate regions of enhancement mode transistors of threshold typically about +0.7 volt.

The active gate and source and drain (GASAD) regions were then patterned by reactive sputter etching to form field oxide layers 14 on the top major surface 13.5 of the wafer. A sacrificial oxide layer was then grown in the GASAD regions. Arsenic doped p$^-$ region 13.1 was selectively implanted through a protective masking layer, typically a tri-level resist system (not shown), for obtaining a suitable threshold of a depletion mode transistor to be fabricated, typically about −1.0 volt. The sacrificial oxide layer was then removed, to form the structure 10 illustrated in FIG. 1.

Figure 2:
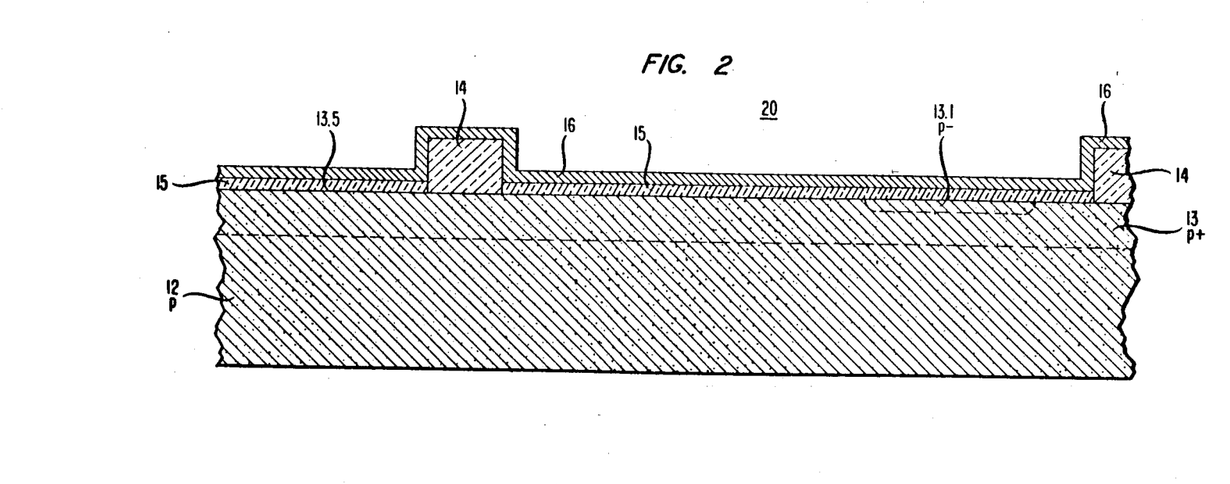

Then, a relatively thin gate oxide layer 15 (FIG. 2) was grown, typically to a thickness of about 250 Angstroms; and immediately thereafter a polysilicon layer 16, typically about 1,500 Angstroms thick, was deposited (undoped) over this gate oxide layer 15, to form the structure 20 illustrated in FIG. 2.

Figure 3:
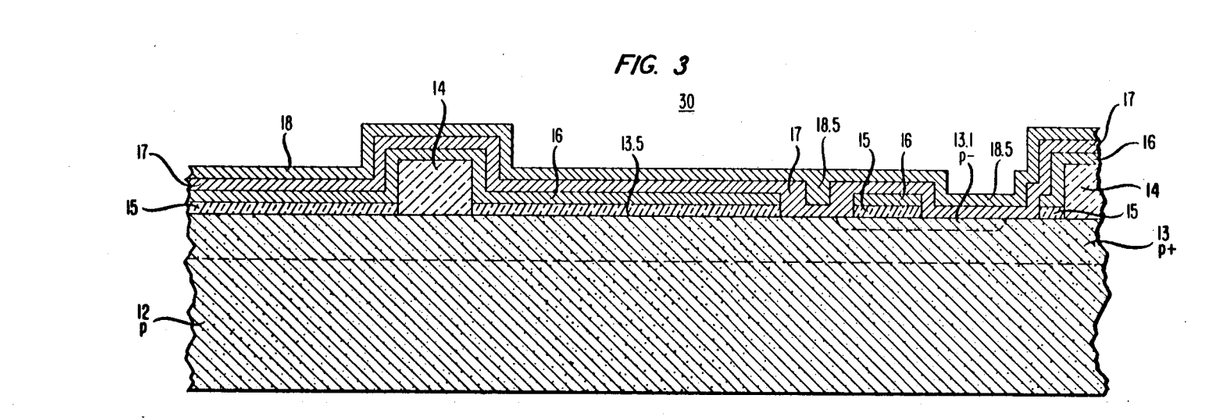

Next (FIG. 3), apertures were opened through the polysilicon layer 16 and the gate oxide layer 15, for forming buried contacts, that is, contacts between first level polysilicon metallization and the top surface 13.5 on the body. For this purpose, reactive sputter etching with chlorine to etch the polysilicon, followed by a mixture of $CHF_3$ and oxygen to etch the gate oxide, was used, and a second polysilicon layer 17 was then deposited and implanted with arsenic ions. Then a tantalum silicide layer 18 was deposited to form a thickness of typically about 2,500 Angstroms, to form the structure 30 illustrated in FIG. 3, including the contacts 18.5 through the oxide layer 15 and the polysilicon layer 16 to the surface region 13. Note that a relatively small lateral portion of the gate oxide layer 15 remains at the left-hand edge of the field oxide layer 14, owing to deliberate alignment or unavoidable misalignment of the corresponding edge of the corresponding aperture through the original gate oxide layer.

Figure 4:
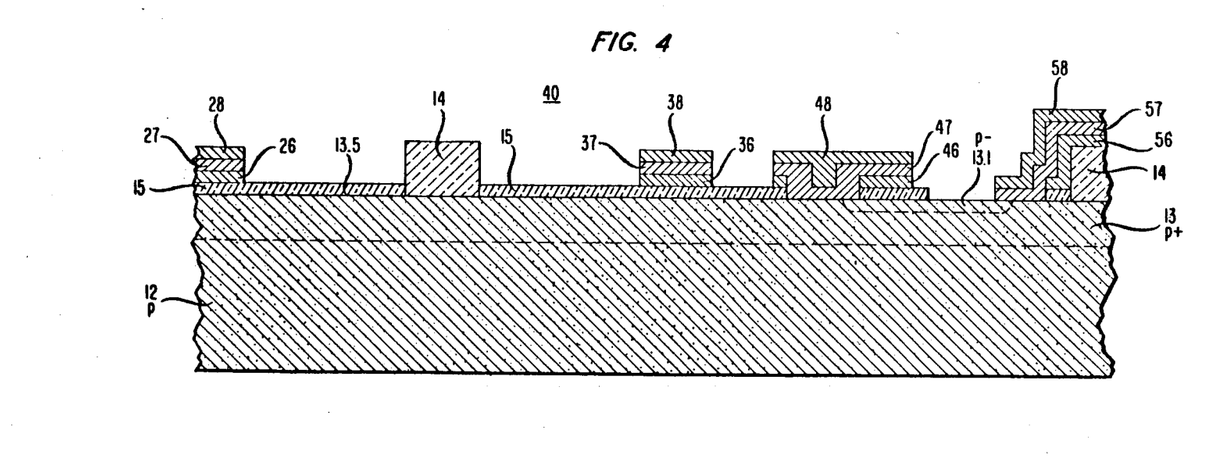

Next lithographic patterning to define the gates and gate-level interconnections was accomplished by reactive sputter etching with $CFCl_3$, to etch through the tantalum silicide layer 18, followed by a mixture of chlorine and oxygen to complete the etching through the polysilicon layers 17 and 16. As a consequence of the patterning of the tantalum silicide layer 18 and the polysilicon layers 17 and 16, there remain in the structure 40 being built (FIG. 4) polysilicon layer portions 26, 36, 46, and 56, stemming from the original polysilicon layer 16, as well as polysilicon layer portions 27, 37, 47, and 57 stemming from the original polysilicon layer 17, and tantalum silicide layer portions 28, 38, 48, and 58 stemming from the original tantalum silicide layer 18. The layer portions 26, 27, and 28 form the gate electrode of an enhancement transitor being built; the layer portions 36, 37, and 38 form the gate electrode of a next neighboring enhancement transistor being built; the layer portions 46, 47, and 48 form a gate electrode of a depletion mode transistor being built with its source connected to its gate electrode; and the layer portions 56, 57, and 58 form drain interconnection metallization for this depletion transistor.

Figure 5:
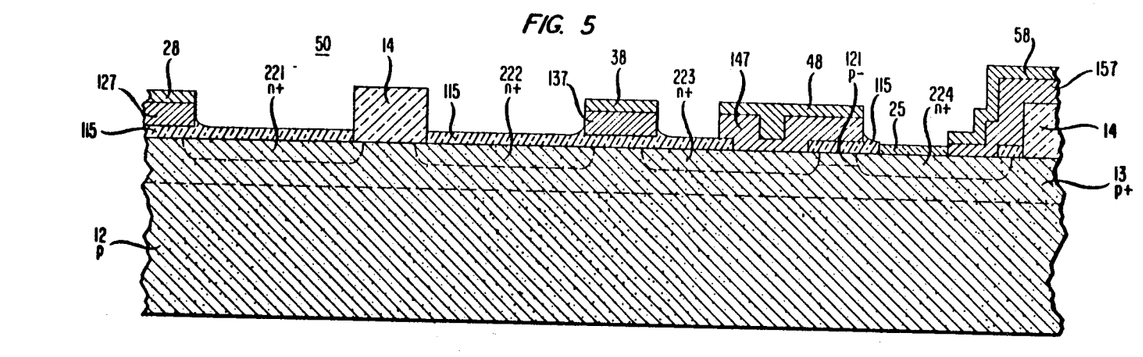

Then the tantalum silicide is sintered, whereby the impurities in the polysilicon layer portions 27, 37, 47, and 57 diffuse into the polysilicon layer portions 26, 36, 46, and 56 to form separate polysilicon layers 127, 137, 147, and 157, respectively (FIG. 5). Exposure of the top surface 13.5 at window 31 can thus result.

Next the wafer is thermally reoxidized to grow a protective silicon dioxide layer 25, at any exposed portions of the top surface 13.5, as well as to coat the polysilicon and silicide layers with oxides (not shown), and then a self-aligning source and drain implant is performed with arsenic ions. Thereby in the structure 50 illustrated in FIG. 5, a self-aligned n+ impurity region 221 forms the source of drain region of the enhancement transistor being built, self-aligned n+ impurity region 222 forms the source or drain region of the next neighboring enhancement transistor being built, self-aligned n+ impurity region 223 forms the source region of the depletion transistor being built, and self-aligned n+ impurity region 224 forms the drain region of this depletion transistor. As a result of the high temperature of the thermal reoxidation, the doped and undoped polysilicon layer portions stemming from the dopsed and undoped polysilicon layers 17 and 16 become less distinguishable, and are consolidated and indicated in FIG. 5 by reference numerals 127, 137, 147, and 157 (one reference numeral for each resulting consolidated layer portion).

Next, a P-glass layer 19 was deposited from phosphorus doped tetra-ethyl-ortho-silicate (P-TEOS) to a thickness of about two microns; the phosphorus concentration tnherein was about 5 percent by weight, to within about 0.5 percent. This phosphorus concentration is, in any event, preferably less than about 6 percent, although concentrations as high as about 8 percent may be workable. This P-glass layer was densified by heating in a nitrogen ambient. Then a polychrome photoresist was applied everywhere upon the top surface of the P-glass layer for the purpose of plasma planarization with a mixture of $CF_4$ and oxygen, whereby the thickness of the P-glass layer was reduced to about one micron. The top surface of this polysilicon layer is advantageously substantially everywhere planar (except at contact windows), so that second level aluminum metallization strips can be formed thereon with uniform thickness, in order to prevent failures (breaks) in the aluminum metallization strips otherwise produced by electromigration of aluminum from thinner to thicker regions of the aluminum strips during current flow therethrough.

Then the P-glass layer was annealed in steam. Windows were opened through both this planarized P-glass layer and the silicon dioxide layer 115 by photolithographic masking and etching to expose the top surface 13.5. For the masking of the P-glass layer, a tri-level resist process was used as described, for example, in a paper by J. M. Moran and D. Maydan entitled "High Resolution, Steep Profile Resist Patterns," published in the *Bell System Technical Journal*, Vol. 58, 1979, pp. 1027–1036, but with a thinner than conventional bottom resist layer (about 1.0 micron thick to within 0.2 micron, rather than the conventional thickness of about 1.8 micron or more). Briefly, this thinner bottom resist layer (without the need for plasma planarization thereof) was found to be desirable to produce reliable and uniform window patterns (probably) because of optical reflection interference problems associated with a thicker bottom resist layer during optical focusing-tracking alignment of the structure for subsequent photolithography. This system is useful even when the underlying surface is planar, because it affords a more robust mask for patterning using reactive sputter (ion) etching. For the patterning by etching of the P-glass layer, a mixture of $CHF_3$ and oxygen was used.

Figure 6:
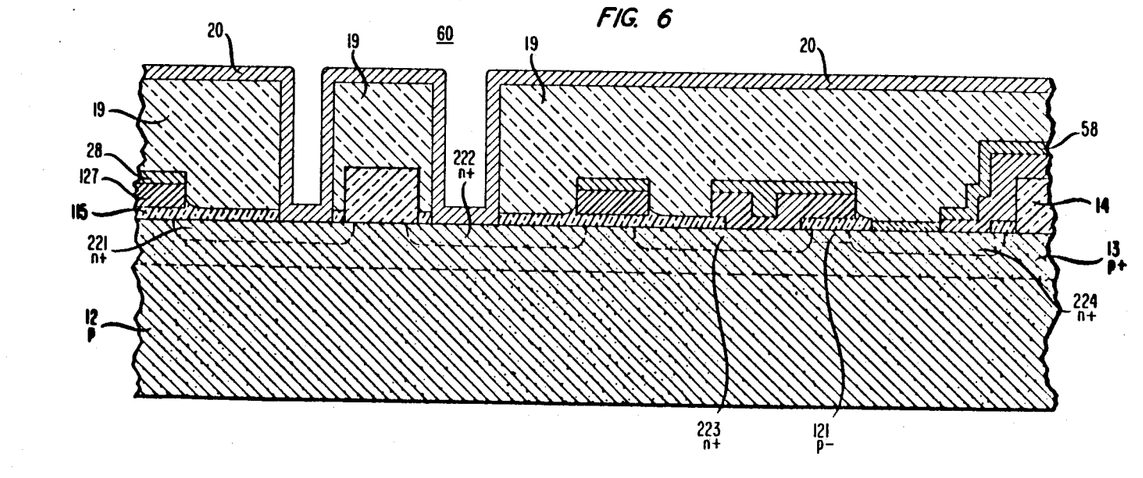

Then a polysilicon contact layer 20 was deposited on the top surface of the structure to a thickness of typically about 2,500 Angstroms. Advantageously, the polysilicon contact layer 20 is deposited by chemical vapor deposition, so that it deposits conformally over steps; that is, it deposits with good step coverage over the P-glass layer even though the apertures therein are not smoothed by the usual reflow. In order to minimize the undesirable effects of lateral diffusion of impurities, particularly in the p+ region 13, and to minimize possible lateral leakage under the field oxide, the polysilicon contact layer was doped by arsenic implantation, typically at about 60 keV to a dose of about $7\times10^{15}$ impurity atoms per square centimeter. The resulting structure 60 is illustrated in FIG. 6.

Figure 7:
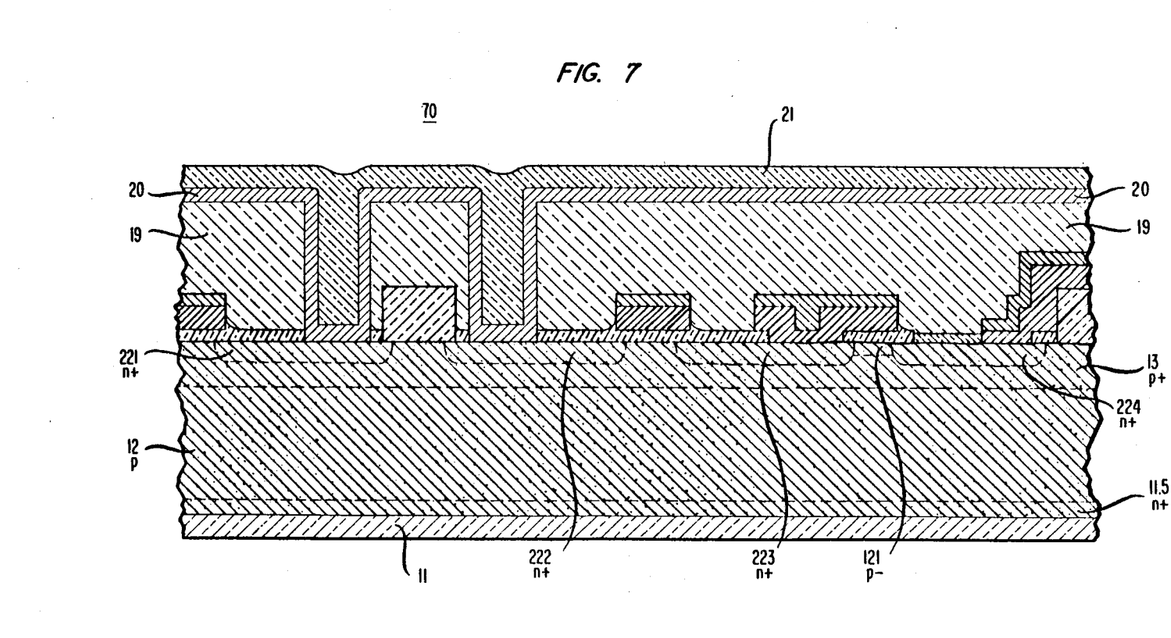

Then an "undoped" protective glass layer 21 was deposited from phosphorus-free TEOS (FIG. 7) to a thickness of about 3,000 Angstroms in order to cap the structure being built, and thereby also to fill any remaining portions of the apertures in the P-glass layer 19 (not occupied by the polysilicon layer 20). The "undoped" glass can have a concentration of as much as 1 or 2 percent phosphorus by weight (such a concentration ordinarily unavoidably resulting from residual contamination of the walls of the chamber in which the undoped TEOS deposition is performed—i.e., the same chamber as that in which the phosphorus doped glass was deposited earlier). All layers of polysilicon, tantalum silicide, and glass (not shown) which have accumulated on the bottom surface of the silicon body 12 were removed by etching while the entire top surface of the structure was protected by a photoresist layer (not shown).

This photoresist layer was then removed and the structure was subjected to a gettering treatment at about 950 degrees C. for about an hour in an ambient containing phosphorus, typically phosphorus tribromide. Thereby a phosphorus doped glass layer 11 and an n+ impurity region 11.5 formed during this gettering treatment on the bottom surface of the silicon body 12, as indicated in the structure 70 shown in FIG. 7. Both this phosphorus doped glass layer 11 located on the bottom surface and the (undoped) glass layer 21 located on the top surface were removed by a liquid etching which does not attack silicon. The n+ region 11.5 was thereafter removed, as by sputter etching with a mixture of CF4 and oxygen. Then the structure being fabricated was annealed in a hydrogen ambient. Then an aluminum (metallization) layer was deposited to a thickness of about a micron upon the top and bottom surfaces of the structure. The aluminum layer on the top surface together with the polysilicon layer 20 was then patterned in accordance with the desired second level metallization pattern by lithographic resist masking and reactive sputter etching with a mixture of BCl3 and Cl2 followed by pure Cl2 to complete the etching of the polysilicon. Immediately thereafter, the remaining resist was removed by sputter etching with a mixture of CF4 and oxygen. Thus (FIG. 8) a patterned aluminum layer 41 on a patterned polysilicon layer 40 was formed on the top surface whereas an unpatterned aluminum layer 51 remains on the bottom surface, to form the structure 80 shown in FIG. 8. A final anneal in a hydrogen ambient was performed.

Note that during the gettering step, despite the high gettering temperature of 950 degrees C., the P-glass layer 19 cannot and does not flow, because of the presence of the polysilicon layer 20 and the undoped glass layer 21 (FIG. 7) which thus mechanically prevents flow of the P-glass layer 19. Thus, in particular, there is no undesired distortion of the contours of the polysilicon layer 20 in regions of contact with the top surface 13.5 of the semiconductor or in other regions of the apertures in the P-glass layer 19 where the aluminum layer 41 later (FIG. 8) fills in. Thus, the polysilicon layer 20 combined with the undoped glass layer 21 to prevent any undesirable flow of the P-glass layer 19 anywhere into the regions of these apertures.

Figure 8:
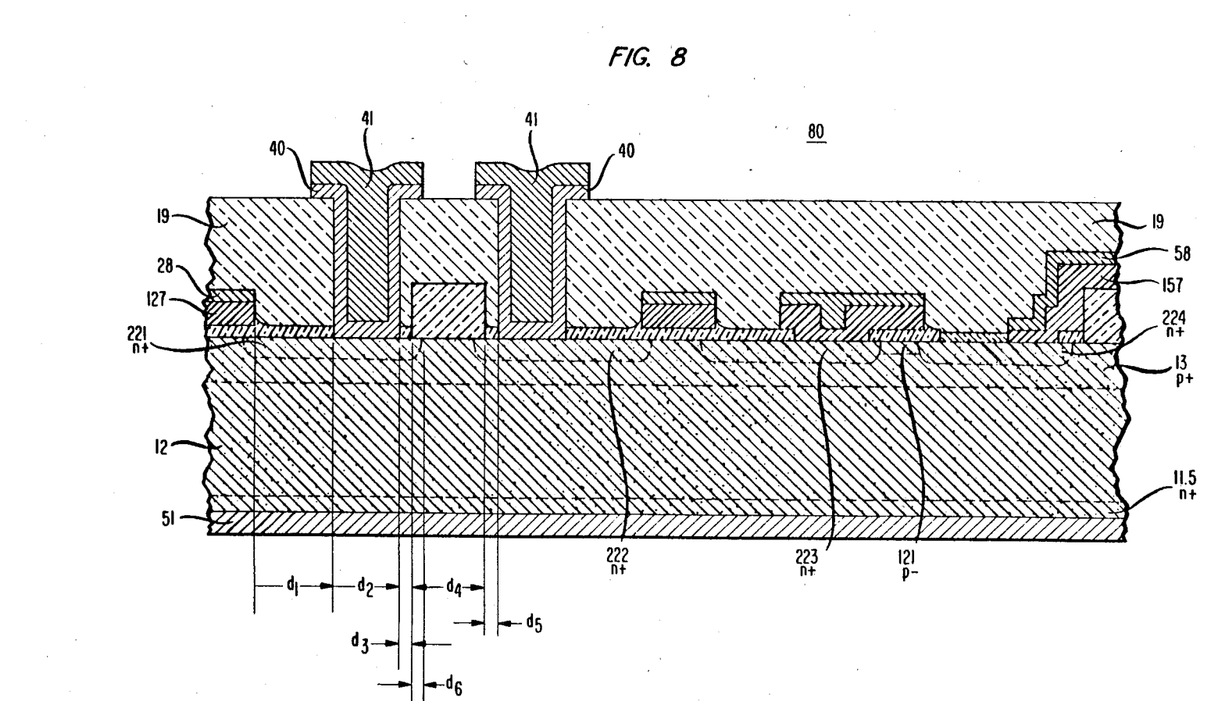

In this way, static random access memory (SRAM) circuits were successfully built and tested with 1.0 micron design rules. FIG. 8 depicts an illustrative portion of such circuit, with a source region 221 and a polysilicon gate electrode 127 of one enhancement transistor, together with a source region 222 and polysilicon gate electrode 137 of a next neighboring enhancement transistor. The distance $d_1$ between the proximate edges of the gate electrode 127 and the polysilicon layer 40—serving as a source contact electrode—was about 1.0 micron, i.e., the minimum feature size of the 1.0 micron design rules; the width $d_2$ of this source contact electrode was about 1.1 micron (corresponding to the size of the aperture in the P-glass layer 19); the distance $d_3$ between proximate edges of this contact electrode and the field oxide layer 14—i.e., the remaining lateral thickness of the P-glass layer 19 thereat—was about 0.2 micron; the width $d_4$ of the field oxide layer 14 was about 1.0 micron; and the distance $d_5$ between proximate edges of this field oxide layer 14 and the source contact electrode of the next neighboring transistor was about 0.2 micron, i.e., approximately the same as $d_3$. The distance $d_6$ that the source region 221 tucked under the field oxide layer 14 was about 0.25 micron, and similarly the vertical depth of the source region 221 was also about 0.25 micron. On the other hand, a phosphorus (instead of arsenic) doped polysilicon electrode layer 40 (even though the source and drain regions were doped with arsenic) was found to cause the source region 221 to tuck under the field oxide to such a lateral extent that it overlaps the source region 222, whereby an undesirable short circuit formed between these source regions 221 and 222. An exemplary figure of merit for the dense packing in the structure 80 is the distance $(d_3+d_4+d_5)$ of closest approach between the edges of next neighboring polysilicon electrode contacts, that is, about $0.2+1.0+0.2=1.4$ micron.

Although the invention has been described in detail in terms of a specific embodiment, various modifications can be made without departing from the scope of the invention. For example, instead of arsenic, antimony can be used for doping the polysilicon contact layer or the source and drain regions or both.

What is claimed is:
1. In a method of fabricating a semiconductor integrated circuit integrated at a top major surface of a semiconductor body, the step of:
gettering the body with phosphorus by heating the body at an elevated temperature in an atmosphere containing phosphorus at a time when the top surface, but not the bottom surface, of the body is protected against the penetration of phosphorus by means of a sacrificial glass layer which has a sufficiently low phosphorus concentration that essentially no phosphorus diffuses from it into the body.
2. In a method of fabricating a semiconductor circuit including a plurality of transistors integrated at a top major surface of a silicon semiconductor body, the steps of:
(a) forming polysilicon layer doped with arsenic or antimony upon the sidewalls and the bottom surfaces of apertures extending through an insulating layer coating the top surface, whereby the polysilicon layer makes contact, at the bottom of each of the apertures, with at least first and second separated localized regions doped with arsenic or anitmony located at the top surface of the body, the first and second regions being terminal regions of first and second transistors, respectively;

(b) depositing a sacrificial protective layer upon the polysilicon layer, to protect the top surface of the body against introduction of phosphorus;

(c) gettering the semiconductor body by a heat treatment at a gettering temperature in an ambient atmosphere containing phosphorus at a time when the protective layer is present on the polysilicon layer, whereby phosphorus from the ambient enters into the silicon body through the bottom major surface of the body but not through the top major surface thereof.

3. In the method of fabricating a semiconductor circuit according to claim 2, the steps recited in claim 2 followed by the steps of:

removing the protective layer to expose the polysilicon layer;

depositing a metal layer upon the polysilicon layer; and patterning the metal layer and the polysilicon layer in accordance with the circuit.

4. The method of claim 2 in which the insulating layer is essentially a deposited glass layer doped with phosphorus to a concentration of about 5 percent by weight.

5. The method of claim 2 in which the insulating layer is essentially a deposited glass layer doped with phosphorus to a concentration less than the saturation level.

6. The method of claim 3 in which the metal is essentially aluminum.

7. The method of claim 5 in which the gettering temperature is about 950 degrees C., and in which the sacrificial protective layer is essentially a deposited glass layer containing less than about 2 percent phosphorus by weight and having a sufficient thickness whereby any significant flow of the glass layer doped with phosphorus into the apertures during gettering is mechanically prevented by the presence of the polysilicon layer and the protective layer.

8. The method of claim 7 in which the protective layer is essentially TEOS deposited glass.

9. A process for making a plurality of MOS transistors at a top major surface of a silicon semiconductor body comparing the steps of:

(a) forming relatively thick field oxide layer on areas of the top major surface located between GASAD regions of the transistors to be formed;

(b) growing a relatively thin gate oxide layer in the GASAD regions;

(c) forming and patterning an arsenic doped polysilicon layer, overlaid with a metal silicide layer, on top of the gate and field oxide layers in accordance with the pattern of the first level metallization of the desired integrated circuit, whereby the gate oxide layer is exposed at areas overlying the source and drain regions of the transistors to be formed in the semiconductor body;

(d) introducing arsenic through the exposed areas of the gate oxide into the semiconductor body at the source and drain regions to form arsenic-doped source and drain regions;

(e) forming and planarizing a P-glass layer having a phosphorus doping level below the saturation level, and forming apertures in the P-glass layer at locations thereof where electrical contacts to the source and drain regions and to the first level metallization are to be formed;

(f) depositing another polysilicon layer for making these contacts;

(g) implanting arsenic into the last-mentioned polysilicon layer;

(h) forming a phosphorus-impervious glass layer on the top surface of the structure being built, and removing from the bottom surface any glass layers which have formed on the bottom surface;

(i) gettering the structure by a heat treatment in an ambient atmosphere containing phosphorus;

(j) removing the phosphorus-impervious glass layer everywhere from the top surface to expose the last-mentioned polysilicon layer;

(k) depositing a metal layer upon the last-mentioned polysilicon layer; and (l) patterning the metal layer and the last-mentioned polysilicon layer to form source and drain metallization interconnections in accordance with the desired integrated circuit.

10. The method of claim 9 in which the P-glass layer contains about 5 percent phosphorus by weight.

11. The method of claim 9 in which the metal is aluminum.

12. The method of claim 10 in which the phosphorus-impervious glass layer is deposited from essentially phosphorus-free TEOS.

* * * * *